June 27, 1972 D. DE WITT ET AL 3,672,983

PROCESS FOR MAKING METAL CONTACTS TO HIGH SPEED TRANSISTORS AND PRODUCT FORMED THEREBY

Filed Jan. 9, 1970

INVENTORS

A. S. OBERAI

V. A. DHAKA

D. DEWITT

BY Sughrue, Rothwell, Mion, Zinn & Macpeak

ATTORNEYS 3,672,983

PROCESS FOR MAKING METAL CONTACTS TO HIGH SPEED TRANSISTORS AND PRODUCT FORMED THEREBY

David De Witt, Poughkeepsie, Vir A. Dhaka, Hopewell Junction, and Avtar S. Oberai, Wappingers Falls, N.Y., assignors to International Business Machines Corporation, Armonk, N.Y.

Filed Jan. 9, 1970, Ser. No. 1,673
Int. Cl. H01l 7/34
U.S. Cl. 117—212 2 Claims

ABSTRACT OF THE DISCLOSURE

In a semiconductor device, the emitter and base metal contact stripes are at different levels and are separated by silicon dioxide and silicon nitride. By using such a silicon dioxide separatory layer in combination with an initial silicon nitride coating over the emitter and base regions in the semiconductor substrate, the silicon nitride coating being etched during processing, a high speed transistor having a very small emitter-base contact spacing, and a small emitter stripe width is obtained.

BACKGROUND OF THE INVENTION

Field of the invention

The present invention relates to processes for forming metal contacts to high speed transistors, and high speed transistor contacts per se.

Description of the prior art

As work in integrated circuits involving high speed transistors has progressed, a number of requirements have been discovered which ultra high speed transistors must exhibit. As recognized in the art, the term "ultra high speed" as applied to transistors means alpha cut-off frequencies above 5 GHz. and switching speeds faster than 300 picoseconds.

First, the emitter-base contact spacing is generally very small in high speed transistors, on the order of 2 microns. This is so that the transistor characteristics, namely the extrinsic base resistance and the collector capacitance, can be kept to a minimum.

Second, the emiter contact stripe width is also typically very small, generally in the area of 1 to 2 microns.

Taking these two requirements together, they result in two major problems: first a very high current density in the emitter contact stripes; secondly, difficulty in etching contact metal due to limitations on current state of the art photomasking and photoresist processes.

The prior art has known of fabrication schemes for forming transistors which permit the metal layer that contacts the emitter to be placed over the metal layer which contacts the base by separating the metal layers with a lamination of glass and $SiO_2$. U.S. Pat. 3,383,568. This scheme is adapted to low and medium speed and power transistors but not to the ultra high speed devices which can be made by the present invention. Pat. 3,383,568 teaches the formation of the emiter contact hole by etching a hole in the thermal oxide after the emiter is diffused. In order to insure that the contact hole does not go outside the emitter area and cause a base-emiter short, at least 2 microns of clearance must be left on each side so that a minimum practical emitter width would be about 7 microns. This 2 micron clearance is required because of photo engraving accuracy and the inability to completely control oxide undercutting. There is another art for opening the emitter contact hole which uses the fact that the thermal oxide over the emitter is thinner than that elsewhere and hence if the entire surface is etched without masking, the emitter holes will open before oxide elsewhere is completely removed. This method has been found difficult to control in practice and produces devices which fail early in life because of emitter-base shorting and shorting in other areas where local weakness in the oxide has been made worse by the exposure to etch. Even if this method were made practical, the invention of Pat. 3,383,568 requires that a patch of glass be located over each base contact by a photolithographic process which leaves glass slurry only where it is desired. The slurry is subsequently oxidized to remove organic components and then melted to form a glass. The accuracy of the photolithography and the lack of precise control of the location and shape of the edge of the melted glass surface requires that at least 8 microns of spacing be provided between the emitter contact and base contact metal to insure absence of glass over the emitter contact metal and complete coverage of the base contact metal.

SUMMARY OF THE INVENTION

In forming metal contacts to high speed transistors, improved results are obtained by the use of a silicon nitride layer in combination with silicon dioxide layers. The differential etch rate of silicon nitride which after initial etching can serve as an in situ mask and silicon dioxide provides an improved processing scheme and a novel high speed transistor.

By separating metallization layers, i.e., contact stripe layers, with silicon dioxide, specifically by forming emitter contacts and base contacts at different levels (separated by silicon dioxide), the emitter contact stripe can be made wider and thicker, thereby lowering current density.

One object of the present invention is to provide a process for forming high speed transistors.

A further object is to provide a novel high speed transistor.

Another object is to provide a high speed transistor with vertically separated emitter and base metal stripes.

Still yet another object is to provide an emitter contact stripe wider and thicker than those of the prior art by an unique processing scheme thereby providing lower current density in the emitter contact stripe and avoiding the metal etching problems of the prior art.

The means for accomplishing all of the above objects will become clear in view of the detailed description of the invention following the material relating to the drawings.

DETAILED DESCRIPTION OF THE PREFERRED EMBODIMENTS

Figure 1:
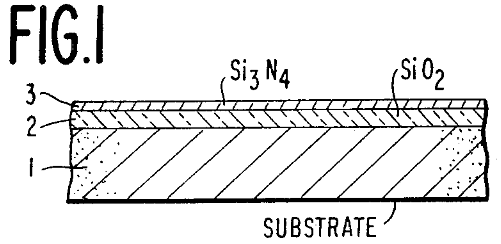
FIGS. 1–9 illustrate a high speed transistor being formed according to one alternative of this invention.

The present disclosure should be read in the context of providing an ultra high speed transistor illustrating lowered current density in the emitter stripe and in the context of providing a process for making metal contacts to high speed transistors wherein the problems encountered in etching various metallization layers are greatly reduced.

The process of the present invention does not really enter into a high speed transistor processing scheme until the transistors have been fabricated to the step of base diffusion. Up to this point, any well known prior art technique can be used. The following discussion will, however, be limited to the treatment of a P-type silicon "transistor" base doped with boron to a surface concentration of about $10^{19}$ atoms/$cm.^3$. This may be formed by any of the standard state of the art techniques.

After the base diffusion, the first step in the process of the present invention is to grow a thermal oxide layer. Typically, such a layer can be grown by any of the methods known in the art, a preferred method being the exposure of the wafer to dry $O_2$ at 970° C. for 4 minutes followed by exposure to steam at 970° for 7 minutes. The resulting thermal oxide is about 700 A. thick.

Immediately following the growth of the thermal oxide layer, a layer of silicon nitride is deposited. It is preferred that the silicon nitride be formed by the high temperature silane and ammonia process. A room temperature mixture of $SiH_4$ flowing at 2 cc./minute, $NH_3$ flowing at 40 cc./minute and $N_2$ flowing at 10 liters per minute is flowed through a reactor in which the silicon wafers are held at a temperature in the range of 800 to 900° C. Silicon nitride of suitable quality and properties is deposited at about 150 A./minute. Generally, the silicon nitride will be deposited to a thickness within the range 500 to 1000 microns, although this is substantially non-critical. A discussion of silicon nitride deposition can be found in Doo, Nichols and Silvey, Journal of the Electrochemical Society, vol. 113, p. 1279, 1966.

After the above two steps, two alternative techniques for forming the metal contacts to the high speed transistor of the present invention exists.

The first technique will be explained with reference to FIGS. 1–9 in the drawings.

In FIG. 1, the transistor of the present invention is shown after the thermal oxide has been grown and the silicon nitride film has been deposited. The silicon wafer is identified by numeral 1. The thermal oxide layer by numeral 2 and the silicon nitride layer by numeral 3. The dimensions of the portion of the silicon wafer included in 1 are .4 mil x .4 mil, the thickness of the silicon layer is 7 mils and the thickness of the silicon nitrile layer is 800 A.

Figure 2:
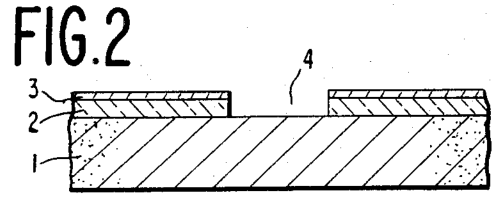

In FIG. 2, an emitter diffusion window 4 has been opened in the silicon nitride layer 3 and the thermal oxide (silicon dioxide layer) 2.

Figure 3:
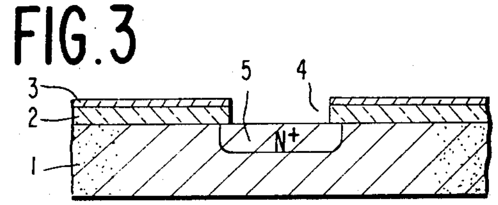

In the next step, shown in FIG. 3, N+ emitter 5 is diffused into the P base through the emitter diffusion window 4. Typically, standard state of the art N+ impurities may be diffused into the P base. In this example, the N+ impurity was arsenic, and it was diffused into the P base to a concentration level of $10^{21}$ atoms/$cm.^3$. A high temperature state of the art vapor phase diffusion at 1050° C. was used.

Figure 4:
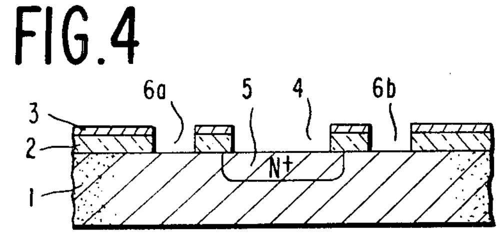

The next step of the present invention, illustrated in FIG. 4, comprises opening the base contact hole and other desired contact holes in the silicon nitride layer 3 and the silicon dioxide layer 2. These contact holes are illustrated by numbers 6*a*, 6*b*, etc.

Figure 5:
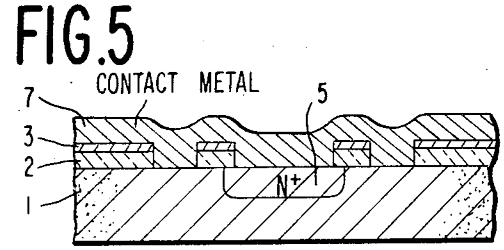

Immediately following opening of the base and contact holes, the first metal layer 7 is deposited completely over the surface of the transistor, as shown in FIG. 5. This metal 7 is aluminum, but may be any standard state of the art metal utilized to form ohmic contacts to a transistor structure, such as molybdenum over a thin platinum layer. The thickness of the layer 7 is 0.4 micron.

Figure 6:
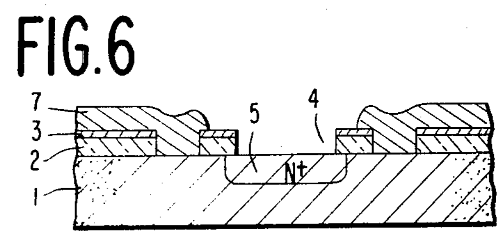

The next step of the present invention is illustrated in FIG. 6, and comprises etching the metal 7 from the emitter diffusion window 4. This can be performed by any standard state of the art etching technique, for instance, in this case when the metal is aluminum, an etching solution of 80 parts concentrated $H_3PO_4$, 4 parts concentrated $HNO_3$ and 10 parts $H_2O$ by volume is used. The metal is permitted to remain on the base contact and all other contacts formed as heretofore described.

Figure 7:
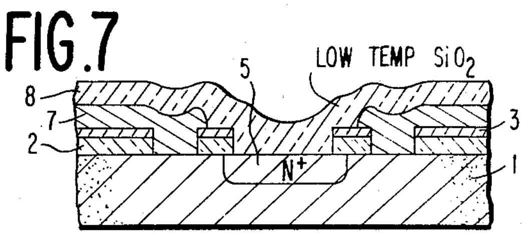
Figure 8:
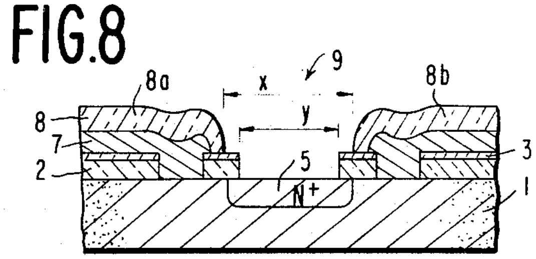

As shown in FIG. 7, the transistor is next subjected to a low temperature silicon dioxide deposition. The silicon dioxide layer 8 completely covers the metal layer 7 and, of course, completely covers the emitter area 4 wherein the metal layer 7 was removed by the heretofore described metal etching step. Any standard state of the art low temperature silicon dioxide deposition process can be used, the temperatures of deposition typically being along the lines of 400 to 450 C. One acceptable process is to bubble 4.5 liters per minute through tetraethylorthosilicate at 25° C. and combine the effluent stream with 4.4 liters per minute of $N_2$ at 25° C. The combined gas stream is flowed through a reactor in which the wafers are held between 450 and 500° C. 3000 to 5000 A. are grown at a rate of about 150 A./minute. An alternate process uses a gas stream consisting of 30 liters/minute of $H_2$, 32.5 cc./minute of $O_2$ and .5 cc./minute of $SiH_4$. The deposition rate is about 100 A./minute.

According to the first embodiment of the present invention (shown in FIG. 8), the next step is to open an emitter via hole in the low temperature silicon dioxide layer 8. The emitter window or via hole 9 is made larger than the emitter stripe width, which is equivalent in area to original hole 4 because the silicon nitride layer 3 will not be attacked in the oxide etching step. The diameter of the emitter window or via hole is represented by *x* whereas the diameter of the emitter stripe width is represented by *y*. It is this unique step which is one of the most novel aspects of this embodiment of the present invention. Whereas heretofore contemplated prior art schemes have necessitated very strict control of photoresist and photoetching techniques, the silicon nitride of the present invention serves in the formation scheme of the high speed transistor of the present invention as an "in situ" resist.

That is, in this embodiment the silicon nitride will not be attacked by the etchant which is used to open the emitter window in the low temperature silicon dioxide layer 8. Thus, the silicon nitride serves to protect the emitter stripe area formed by layers 2 and 3 from being widened simultaneously with formation of the emitter window or via hole. Further, in addition to enabling the formation of an expanded emitter contact stripe, the base contact stripe 7 is "separated" from the emitter contact stripe by low temperature silicon dioxide layer portion 8*a* and 8*b*.

Figure 9:
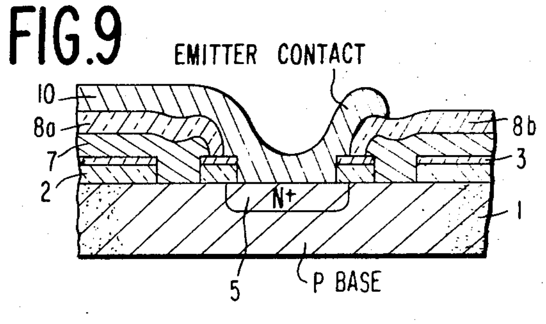

Thus, the final metal emitter contact 10 which is deposited in the emitter window 9 as shown in FIG. 9 is isolated by a layer of etch resistant silicon nitride and a layer of silicon dioxide, whereas the vertical configuration of the emitter contact has been easily formed by etching a low temperature silicon dioxide layer. Isolation is provided, and yet precise control of the emitter contact is achieved.

The finishing steps, no part of this invention, basically comprise depositing and etching the metal for interconnection and emitter contacts, etc. The final structure of transistor formed by this first scheme is shown in FIG. 9 of the drawings. It can be seen that the first level of metal, the base contact, is separated from the second level of metal, the emitter contact, by a low temperature silicon dioxide layer and the silicon nitride layer. Of course, the first layer of metal is separated from the initially grown silicon dioxide layer and the transistor base by the silicon nitride layer which permits the simplified processing scheme of the present invention.

Due to the emitter and base metal stripes being at different levels by the separation with the silicon dioxide and nitride, the emitter contact stripe can thus be made wider and thicker than in the prior art. The current density will thus be reduced and, as heretofore explained, metal etching problems greatly reduced by utilization of the differential etch rate of silicon nitride and silicon dioxide.

Figure 10:
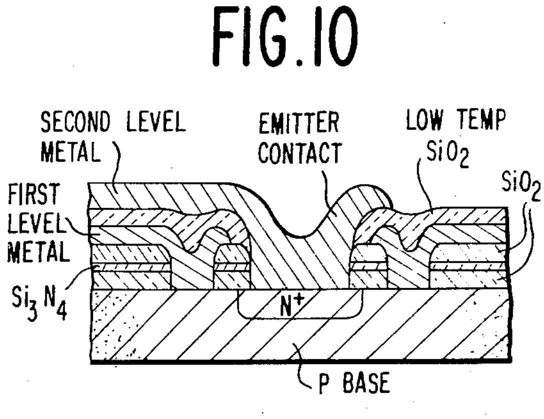
FIG. 10 is a high speed transistor formed according to a second alternative of this invention.

The following scheme is explained only in outline form, and forms the second alternative of the present invention. In this example, only the final transistor structure obtained is shown in FIG. 10.

Basically, the same techniques as in the first scheme above are used, but somewhat different steps are utilized.

The first step is, of course, to grow the thermal oxide (silicon dioxide) layer on the wafer substrate.

The next step is to deposit silicon nitride on top of the initially deposited thermal oxide layer.

In step 3, however, instead of opening only an emitter diffusion window in the silicon nitride and silicon dioxide layers, all contact holes in the emitter diffusion window are open in the silicon nitride layer.

The next step comprises depositing a silicon dioxide layer.

Then, an emitter diffusion window is opened through the newly deposited silicon dioxide layer and the emitter is diffused.

At this time, the base contact and all other contacts, such as the collector contact, are opened in the newly deposited silicon dioxide layer. Of course, these contact holes have already been opened in the silicon nitride layer in step 3 above.

From this point on, the steps of the first processing scheme from the initial deposition of the metallic layer 7 are followed.

The final structure of the transistor formed by this method is shown in FIG. 10.

The above material illustrates the two basic alternatives of the present invention. By following this process, high speed devices with emitters 1 micron or less can be obtained following the essential concept of the use of a silicon nitride in situ resist to obtain ohmic contacts to high speed transistors using a multilayer metallization structure in which the emitter and base metal contacts overlap each other at two levels within the active device area.

What is claimed is:

1. A method of making ohmic metal contacts to emitter and base regions of a semiconductor comprising:

depositing a layer of silicon dioxide on said semiconductor;

depositing a layer of silicon nitride on said silicon dioxide;

forming an emitter diffusion opening through said silicon nitride and silicon dioxide and diffusion an emitter region into base region;

forming base region and other contact holes through said silicon nitride and silicon dioxide layer;

forming a first metal layer all over said semiconductor and removing said deposited metal from said emitter region;

forming a low temperature silicon dioxide layer over said semiconductor and forming an emitter via hole through said silicon dioxide layer having an area greater than the said first emitter diffusion opening and forming an emitter stripe area of less area; and forming a second level metal contact over said emitter region and providing interconnection and emitter contacts.

2. A method in accordance with claim 1 wherein said layer of low temperature silicon dioxide is provided over said emitter base region through an area substantially greater than said emitter base region.

References Cited

UNITED STATES PATENTS

| | | | |
|---|---|---|---|
| 3,551,196 | 12/1970 | Herczog et al. | 117—217 X |
| 3,484,313 | 12/1969 | Tauchi et al. | 148—187 |
| 3,455,020 | 7/1969 | Dawson et al. | 29—571 |
| 3,226,611 | 12/1965 | Haenichen | 117—212 X |

RALPH S. KENDALL, Primary Examiner

U.S. Cl. X.R.

117—217; 148—187